United States Patent
Kashiwagi

(10) Patent No.: US 8,071,707 B2
(45) Date of Patent: Dec. 6, 2011

(54) ADDITION-CURABLE SILICONE COMPOSITION AND CURED PRODUCT THEREOF

(75) Inventor: Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 281 days.

(21) Appl. No.: 12/423,315

(22) Filed: Apr. 14, 2009

(65) Prior Publication Data

US 2009/0259002 A1    Oct. 15, 2009

(30) Foreign Application Priority Data

Apr. 15, 2008 (JP) ................... 2008-105522

(51) Int. Cl.
*C08G 77/12* (2006.01)
(52) U.S. Cl. .......................... 528/31; 528/32
(58) Field of Classification Search ............ 528/31, 528/32
See application file for complete search history.

(56) References Cited

U.S. PATENT DOCUMENTS

| | | |
|---|---|---|
| 2004/0214966 A1 | 10/2004 | Tabei et al. |
| 2005/0137328 A1 | 6/2005 | Staiger et al. |
| 2007/0129508 A1 | 6/2007 | Kashiwagi |
| 2007/0249790 A1 | 10/2007 | Kashiwagi et al. |
| 2007/0265410 A1 | 11/2007 | Loessel et al. |
| 2007/0293623 A1 | 12/2007 | Kashiwagi et al. |
| 2008/0021136 A1 | 1/2008 | Kashiwagi et al. |

FOREIGN PATENT DOCUMENTS

| | | |
|---|---|---|
| EP | 1 544 253 A2 | 6/2005 |
| EP | 1 854 832 A1 | 11/2007 |
| EP | 1 889 877 A1 | 2/2008 |
| JP | 2005-76003 A | 3/2005 |

OTHER PUBLICATIONS

European Search Report for corresponding European Application No. 09251085.8 dated Jul. 28, 2009.

*Primary Examiner* — Kuo-Liang Peng
(74) *Attorney, Agent, or Firm* — Birch, Stewart, Kolasch & Birch, LLP

(57) ABSTRACT

An addition-curable silicone composition is provided. The composition includes (A) a resin structure organopolysiloxane and (B) a platinum group metal-based catalyst. The component (A) has silicon-bonded alkenyl groups and hydrosilyl groups, and includes a structure in which $R^2{}_2SiO$ units, wherein $R^2$ is a methyl group, etc., are connected together in a continuous repeating sequence, and the number of units in the continuous repeating sequence is within a range from 5 to 300. The composition can be prepared in a solid or semisolid form, and hence is suitable conventional molding apparatus such as a transfer molding apparatus, and upon curing, forms a hard resin cured product that exhibits excellent flexibility and minimal surface tack.

14 Claims, No Drawings

ADDITION-CURABLE SILICONE COMPOSITION AND CURED PRODUCT THEREOF

CROSS REFERENCE TO RELATED APPLICATION

This application claims priority to Japanese Patent Application No. 2008-105522, filed on Apr. 15, 2008.

BACKGROUND OF THE INVENTION

1. Field of the Invention

The present invention relates to an addition-curable silicone composition, and relates particularly to an addition-curable silicone composition that yields a cured product with minimal surface tack and favorable strength properties, and a cured product of such a composition.

2. Description of the Prior Art

Addition-curable silicone rubber compositions form cured products that exhibit excellent properties of weather resistance and heat resistance and the like, as well as superior rubber-like properties such as hardness and elongation, and they are therefore used as coating materials and the like in a wide variety of applications (see Patent Document 1). However, because the resulting cured products also exhibit surface tack, dust adhesion becomes a problem when these compositions are used as coating agents or the like for electrical or electronic components.

Cured products formed from hard resins obtained from silicone varnishes exhibit minimal surface tack, meaning the problem of dust adhesion does not arise, but such cured products suffer from a different problem in that because they lack adequate shock resistance, they tend to be prone to cracking, and particularly to cracking caused by thermal shocks. Accordingly, in the field of electrical and electronic component packaging, there is considerable demand for a silicone composition capable of forming a cured product that does not suffer from dust adhesion to the cured product surface, and exhibits excellent levels of crack resistance and shock resistance. Furthermore, a composition that can be cured using conventional molding apparatus, and is a solid (specifically, a plastically deformable solid) or semisolid (i.e., a liquid with a very high viscosity) at room temperature is required.

It is known that adding a resin-form organopolysiloxane component to an addition-curable silicone rubber composition can improve the strength of the cured product. For example, Patent Document 2 discloses an improvement in the strength of the cured product by using a branched (in other words, resin-form) organopolysiloxane as the alkenyl group-containing organopolysiloxane that is subjected to an addition reaction with an organohydrogensiloxane. However, even in those cases where the strength of the cured product is increased by using a resin-form organopolysiloxane, surface tack and dust adhesion remain problems.

It is known that adding a resin-form organopolysiloxane component to an addition-curable silicone rubber composition can generally improve the strength of the cured product. However, even in those cases where the strength of the cured product is increased by using a resin-form organopolysiloxane, surface tack and dust adhesion remain problems. Furthermore, if a hard resin is used, then the shock resistance of the cured product is inadequate, and in particular, a significant problem arises in that the cured product is prone to cracking during thermal shock testing.

In an attempt to address these problems, an addition-curable silicone composition and a cured product thereof have been proposed in which the composition forms a cured product that is a hard resin and yet exhibits excellent flexibility and minimal surface tack, and can be easily molded using a conventional molding apparatus such as a transfer molding, compression molding or injection molding apparatus (Patent Document 3). Furthermore, a silicone lens formed using such a composition and an addition-curable silicone resin composition that is ideal for lens molding have also been proposed (Patent Document 4). Moreover, addition-curable silicone resin compositions that can be used favorably for encapsulating LED elements and the like have also been proposed (Patent Document 5 and Patent Document 6).

However, even with these addition-curable silicone resin compositions, the conventional technique wherein the vinyl group-containing silicone resin and the hydrosilyl group-containing silicone resin are synthesized separately and then combined is not only complex in terms of the steps required, but also suffers various other problems. For example, hydrosilyl group-containing silicone resins are almost always liquid, and the composition obtained upon combining the hydrosilyl group-containing silicone resin with the vinyl group-containing silicone resin is also liquid, which makes the composition difficult to handle as a molding resin.

[Patent Document 1] US2004/0214966A1
[Patent Document 2] JP2005-76003A
[Patent Document 3] US2007/0129508A1
[Patent Document 4] US2007/0249790A1
[Patent Document 5] US2007/0293623A1
[Patent Document 6] US2008/0021136A1

SUMMARY OF THE INVENTION

Accordingly, an object of the present invention is to provide an addition-curable silicone composition that can be prepared in a variety of forms of from a liquid to a solid, particularly in a form of a solid or semisolid as necessary prior to curing, and upon curing, forms a cured product that is a hard resin and yet exhibits excellent flexibility and minimal surface tack, and also to provide a cured product of this resin composition.

As a result of intensive investigation aimed at achieving the above object, the inventors of the present invention discovered that, in an addition-curable silicone composition, by using a specific organopolysiloxane comprising both an alkenyl group bonded to a silicon atom and a hydrosilyl group within a single molecule, they were able to achieve the above object.

In other words, the present invention provides an addition-curable silicone composition, comprising:

(A) an organopolysiloxane formed from $R^1SiO_{1.5}$ units, $R^2{}_2SiO$ units, $R^3{}_aR^4{}_bSiO_{(4-a-b)/2}$ units and $R^3{}_cH_dSiO_{(4-c-d)/2}$ units (wherein each $R^1$, $R^2$ and $R^3$ represents, independently, a hydroxyl group, a methyl group, ethyl group, propyl group, cyclohexyl group or phenyl group, each $R^4$ represents, independently, a vinyl group or allyl group, a represents 0, 1 or 2 and b represents 1 or 2, provided that a+b is 2 or 3, and c represents 0, 1 or 2 and d represents 1 or 2, provided that c+d is 2 or 3), including a structure in which at least a portion of the $R^2{}_2SiO$ units are connected together in a continuous repeating sequence, and the number of units in the continuous repeating sequence is within a range from 5 to 300, and having a molar ratio of hydrogen atoms bonded to silicon atoms relative to the total of all the vinyl groups and/or allyl groups bonded to silicon atoms within the molecule of 0.1 to 4.0, and (B) a platinum group metal-based catalyst in an effective amount for curing.

The composition of the present invention is preferably a solid or semisolid at room temperature, and is most preferably a solid because it can be easily molded using a conventional molding apparatus such as a transfer molding, compression molding or injection molding apparatus. This offers the advantage that the composition can be converted to tablet form or film form. Incidentally, in the discussion in the specification and appended claims, what is meant by "solid" is that a certain material concerned is plastically deformable solid. The solid preferably has a melting point of 30° C. or higher. What is meant by "semisolid" is that a material concerned is highly viscous in such an extent that flowability can hardly be observed at room temperature, and more specifically that the material has a viscosity at 25° C. of at least 10,000 Pa·s.

In a preferred embodiment of the composition of the present invention, the component (A) also includes a silanol group. This embodiment offers the advantage of improved adhesion.

The present invention also provides a cured product obtained by curing the above addition-curable silicone composition.

According to the present invention, a cured product can be formed that is a hard resin and yet exhibits excellent flexibility and minimal surface tack.

Moreover, the composition of the present invention does not require special new molding methods or molding apparatus, and can be molded easily using conventional molding apparatus such as a dispenser, transfer molding, compression molding or injection molding apparatus.

The organopolysiloxane used as the component (A) includes both a lower alkenyl group bonded to a silicon atom and a hydrogen atom bonded to a silicon atom within the same polymer molecule, which offers the advantages of a simple synthesis and reduced production costs.

DETAILED DESCRIPTION OF THE PREFERRED EMBODIMENTS

A more detailed description of the present invention is presented below. In the following description, Me represents a methyl group, Et represents an ethyl group, Ph represents a phenyl group, and Vi represents a vinyl group.

—(A) Resin Structure Organopolysiloxane—

The component (A), which is an important component of the composition of the present invention, is a resin structure organopolysiloxane formed from $R^1SiO_{1.5}$ units, $R^2_2SiO$ units, $R^3_aR^4_bSiO_{(4-a-b)/2}$ units and $R^3_cH_dSiO_{(4-c-d)/2}$ units (wherein each $R^1$, $R^2$ and $R^3$ represents, independently, a hydroxyl group, a methyl group, ethyl group, propyl group, cyclohexyl group or phenyl group, each $R^4$ represents, independently, a vinyl group or allyl group, a represents 0, 1 or 2 and b represents 1 or 2, provided that a+b is 2 or 3, and c represents 0, 1 or 2 and d represents 1 or 2, provided that c+d is 2 or 3), which includes a structure in which at least a portion of the $R^2_2SiO$ units are connected together in a continuous repeating sequence, and the number of units in the continuous repeating sequence is within a range from 5 to 300, preferably from 10 to 300, more preferably from 15 to 200, and still more preferably from 20 to 100, and which has a molar ratio of hydrogen atoms bonded to silicon atoms relative to the total of all the vinyl groups and/or allyl groups bonded to silicon atoms within the molecule of 0.1 to 4.0.

The organopolysiloxane typically contains at least two, and preferably three or more silicon atom-bonded alkenyl groups (namely, vinyl groups and/or allyl groups) within each molecule. Furthermore, the organopolysiloxane typically contains at least two, and preferably three or more hydrosilyl groups within each molecule.

The structure in which the $R^2_2SiO$ units are connected in a continuous repeating sequence, wherein the number of units in the repeating sequence is within a range from 5 to 300, refers to a linear diorganopolysiloxane chain structure represented by a general formula (1) shown below.

(1)

(wherein m represents an integer of 5 to 300)

In the organopolysiloxane of the component (A), at least a portion of the $R^2_2SiO$ units, and preferably 50 mol % or greater (namely, 50 to 100 mol %), and more preferably 80 mol % or greater (namely, 80 to 100 mol %) of all the $R^2_2SiO$ units form the continuous chain structure represented by the general formula (1) within the organopolysiloxane molecule.

In a molecule of the component (A), the $R^2_2SiO$ units cause the polymer molecule to extend in a linear type structure, whereas the $R^1SiO_{1.5}$ units cause branching of the polymer molecule, or the formation of a three dimensional network structure. The $R^4$ groups (the vinyl groups or allyl groups) within the $R^3_aR^4_bSiO_{(4-a-b)/2}$ units perform the role of curing the composition of the present invention by undergoing a hydrosilylation addition reaction with the hydrogen atoms bonded to silicon atoms (namely, the hydrosilyl groups represented by SiH) of the $R^3_cH_dSiO_{(4-c-d)/2}$ units that exist within the component (A).

The molar ratio between the four essential siloxane units that constitute the component (A), namely the molar ratio $R^1SiO_{1.5}$ units: $R^2_2SiO$ units: $R^3_aR^4_bSiO_{(4-a-b)/2}$ units: $R^3_cH_dSiO_{(4-c-d)/2}$ units is preferably within a range from 90 to 24:75 to 9:25 to 0.5:25 to 0.5, and is more preferably within a range from 70 to 28:70 to 20:5 to 1:5 to 1 (provided the total is 100), as such a ratio yields more favorable properties for the resulting cured product.

The polystyrene-referenced weight average molecular weight of the component (A) determined by gel permeation chromatography (GPC) is typically within a range from 3,000 to 1,000,000, and is preferably from 10,000 to 100,000, as this ensures that the polymer is a solid or semisolid at room temperature and provides favorable levels of workability and curability.

This type of resin structure organopolysiloxane can be synthesized, for example, by combining the compounds that act as the raw materials for each of the units, in amounts that enable the four siloxane units to be formed within the product polymer in the required molar ratio described above, and then conducting a cohydrolysis-condensation in the presence of an acid.

Examples of the raw material for the $R^1SiO_{1.5}$ units include chlorosilanes such as $MeSiCl_3$, $EtSiCl_3$, $PhSiCl_3$, propyltrichlorosilane and cyclohexyltrichlorosilane, and the alkoxysilanes such as methoxysilanes that correspond with each of these chlorosilanes.

Examples of the raw material for the $R^2_2SiO$ units include the structures shown below.

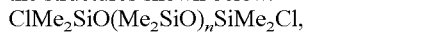
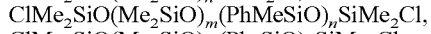
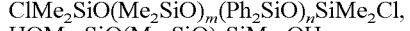
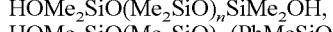
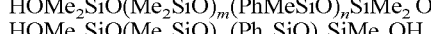
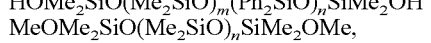
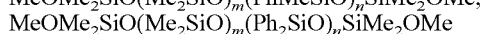
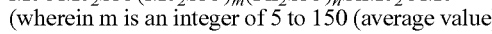

$ClMe_2SiO(Me_2SiO)_nSiMe_2Cl$,
$ClMe_2SiO(Me_2SiO)_m(PhMeSiO)_nSiMe_2Cl$,
$ClMe_2SiO(Me_2SiO)_m(Ph_2SiO)_nSiMe_2Cl$,
$HOMe_2SiO(Me_2SiO)_nSiMe_2OH$,
$HOMe_2SiO(Me_2SiO)_m(PhMeSiO)_nSiMe_2\,OH$,
$HOMe_2SiO(Me_2SiO)_m(Ph_2SiO)_nSiMe_2OH$
$MeOMe_2SiO(Me_2SiO)_nSiMe_2OMe$,
$MeOMe_2SiO(Me_2SiO)_m(PhMeSiO)_nSiMe_2OMe$,
$MeOMe_2SiO(Me_2SiO)_m(Ph_2SiO)_nSiMe_2OMe$ (wherein m is an integer of 5 to 150 (average value), and n is an integer of 5 to 300 (average value))

Furthermore, the $R^3{}_aR^4{}_bSiO_{(4-a-b)/2}$ units represent any combination of one or more siloxane units selected from amongst $R^3R^4SiO$ units, $R^3{}_2R^4SiO_{0.5}$ units, $R^4{}_2SiO$ units, and $R^3R^4{}_2SiO_{0.5}$ units. The raw materials for these units include chlorosilanes such as $Me_2ViSiCl$, $MeViSiCl_2$, $Ph_2ViSiCl$ and $PhViSiCl_2$, and alkoxysilanes such as methoxysilanes that correspond with each of these chlorosilanes.

Furthermore, the $R^3{}_cH_dSiO_{(4-c-d)/2}$ units represent any combination of one or more siloxane units selected from amongst $R^3HSiO$ units, $R^3{}_2HSiO_{0.5}$ units, $H_2SiO$ units, and $R^3H_2SiO_{0.5}$ units. The raw materials for the hydrosilyl groups (SiH groups) include chlorosilanes such as $Me_2HSiCl$, $MeHSiCl_2$, $Ph_2HSiCl$ and $PhHSiCl_2$, and alkoxysilanes such as methoxysilanes that correspond with each of these chlorosilanes.

In the present invention, during production of the organopolysiloxane of the component (A) by cohydrolysis and condensation of the raw material compounds described above, the $R^1SiO_{1.5}$ units, $R^2{}_2SiO$ units, $R^3{}_aR^4{}_bSiO_{(4-a-b)/2}$ units and $R^3{}_cH_dSiO_{(4-c-d)/2}$ units may include siloxane units that contain a silanol group. The organopolysiloxane of the component (A) typically comprises not more than 10 mol % (namely, from 0 to 10 mol %), and preferably not more than 5 mol % (namely, 0 to 5 mol %) of these silanol group-containing siloxane units relative to the combined total of all the siloxane units. Examples of the silanol group-containing siloxane units include $(HO)SiO_{1.5}$, $R^{2a}(HO)SiO$, $(HO)_2SiO$, $(HO)R^4SiO$, $(HO)R^4{}_2SiO_{0.5}$ and $(HO)_2R^4SiO_{0.5}$ units (wherein $R^{2a}$ represents, independently, a methyl group, ethyl group, propyl group, cyclohexyl group or phenyl group, and $R^4$ is as defined above).

In the organopolysiloxane of the component (A), the molar ratio of hydrogen atoms bonded to silicon atoms (SiH groups) relative to the total of all vinyl groups and/or allyl groups bonded to silicon atoms is typically within a range from 0.1 to 4.0, preferably from 0.3 to 4.0, more preferably from 0.5 to 3.0, and still more preferably from 0.8 to 2.0. If this molar ratio is less than 0.3, then the curing reaction proceeds poorly, and achieving the desired silicone cured product becomes difficult, whereas if the ratio exceeds 4.0, then a large amount of unreacted SiH groups tends to remain within the cured product, which can cause changes in the properties of the cured product over time. Accordingly, the ratio of the units containing a silicon atom-bonded alkenyl group, namely the $R^3{}_aR^4{}_bSiO_{(4-a-b)/2}$ units, relative to the total of all the siloxane units within the molecule, is preferably within a range from 0.2 to 45 mol %, and is more preferably from 0.5 to 9 mol %, whereas the ratio of the units containing a hydrosilyl group, namely the $R^3{}_cH_dSiO_{(4-c-d)/2}$ units, relative to the total of all the siloxane units within the molecule, is preferably within a range from 0.09 to 40 mol %, and is more preferably from 0.4 to 8 mol %.

—(B) Platinum Group Metal-Based Catalyst—

This catalyst component is added to accelerate the addition curing reaction within the composition of the present invention, and is typically a platinum-based, palladium-based, or rhodium-based catalyst. From the viewpoint of cost, platinum-based catalysts such as platinum, platinum black, chloroplatinic acid, platinum compounds such as $H_2PtCl_6 \cdot mH_2O$, $K_2PtCl_6$, $KHPtCl_6 \cdot mH_2O$, $K_2PtCl_4$, $K_2PtCl_4 \cdot mH_2O$ and $PtO_2 \cdot mH_2O$ (wherein m represents a positive integer), and complexes of these compounds with hydrocarbons such as olefins, alcohols, or vinyl group-containing organopolysiloxanes are preferred. These catalysts may be used either alone, or in combinations of two or more different catalysts.

The blend amount of the component (B) need only be sufficient to ensure effective curing, and a typical amount, calculated as a mass of the platinum group metal relative to the mass of the component (A), is within a range from 0.1 to 500 ppm, and is preferably from 0.5 to 100 ppm.

—Other Additives—

In addition to the components (A) and (B) described above, the composition of the present invention may also include various conventional additives as required.

—Inorganic Fillers:

Examples of inorganic fillers that may be used include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide. These inorganic fillers may be added to the composition in amounts totaling not more than 600 parts by mass (namely, from 0 to 600 parts by mass) per 100 parts by mass of the combination of components (A) and (B).

—Adhesion Assistants

Furthermore, in order to impart adhesiveness to the composition of the present invention, an adhesion assistant may be added as required. Examples of adhesion assistants include straight-chain or cyclic organosiloxane oligomers of 4 to 50 silicon atoms, and preferably 4 to 20 silicon atoms, comprising at least two, and preferably either two or three, functional groups selected from the group consisting of a hydrogen atom bonded to a silicon atom (SiH group), an alkenyl group bonded to a silicon atom (such as a Si—CH=$CH_2$ group), an alkoxysilyl group (such as a trimethoxysilyl group) and an epoxy group (such as a glycidoxypropyl group or 3,4-epoxycyclohexylethyl group) within each molecule; and organooxysilyl-modified isocyanurate compounds represented by a general formula (2) shown below and/or hydrolysis-condensation products thereof (organosiloxane-modified isocyanurate compounds).

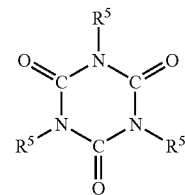

(2)

[wherein $R^5$ represents an organic group represented by a formula (3) shown below:

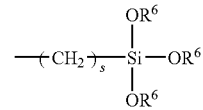

(3)

(wherein $R^6$ represents a hydrogen atom or a monovalent hydrocarbon group of 1 to 8 carbon atoms, and s represents an integer of 1 to 6, and preferably 1 to 4), or a monovalent hydrocarbon group comprising an aliphatic unsaturated bond, provided that at least one of the $R^5$ groups is an organic group represented by the formula (3)]

Examples of the monovalent hydrocarbon group comprising an aliphatic unsaturated bond represented by $R^5$ in the above general formula (2) include alkenyl groups of 2 to 8 carbon atoms, and preferably 2 to 6 carbon atoms, such as a vinyl group, allyl group, propenyl group, isopropenyl group, butenyl group, isobutenyl group, pentenyl group or hexenyl group, and cycloalkenyl groups of 6 to 8 carbon atoms such as a cyclohexenyl group. Furthermore, examples of the monovalent hydrocarbon group represented by $R^6$ in the formula (3) include monovalent hydrocarbon groups of 1 to 8 carbon atoms, and preferably 1 to 6 carbon atoms, including alkyl groups such as a methyl group, ethyl group, propyl group, isopropyl group, butyl group, isobutyl group, tert-butyl group, pentyl group, hexyl group or cyclohexyl group, the alkenyl groups and cycloalkenyl groups listed above for the $R^5$ group, and aryl groups such as a phenyl group. Of these, alkyl groups are preferred.

Moreover, the organosilicon compounds listed below may also be used as adhesion assistants.

Namely, 1-glycidoxypropyl-1,3,5,7-tetramethylcyclotetrasiloxane, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, and the compounds shown below.

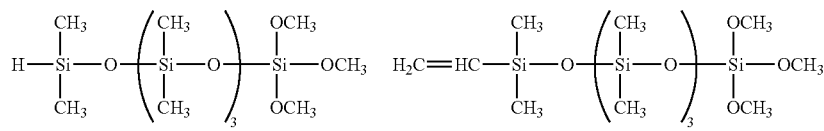

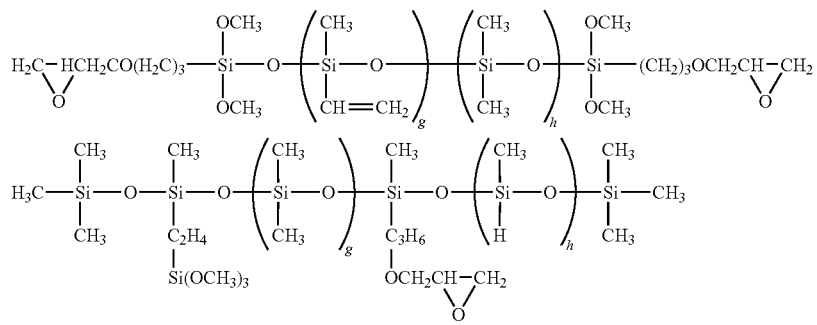

(wherein g and h each represents a positive integer of 0 to 50, provided that g+h is within a range from 2 to 50, and preferably from 4 to 20)

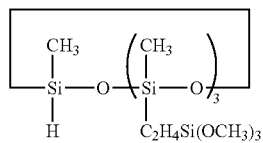

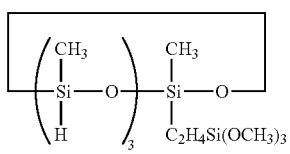

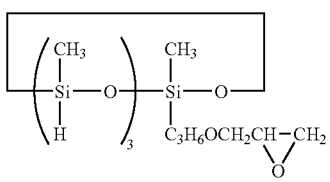

-continued

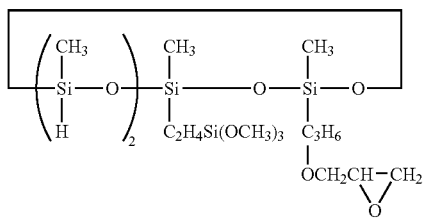

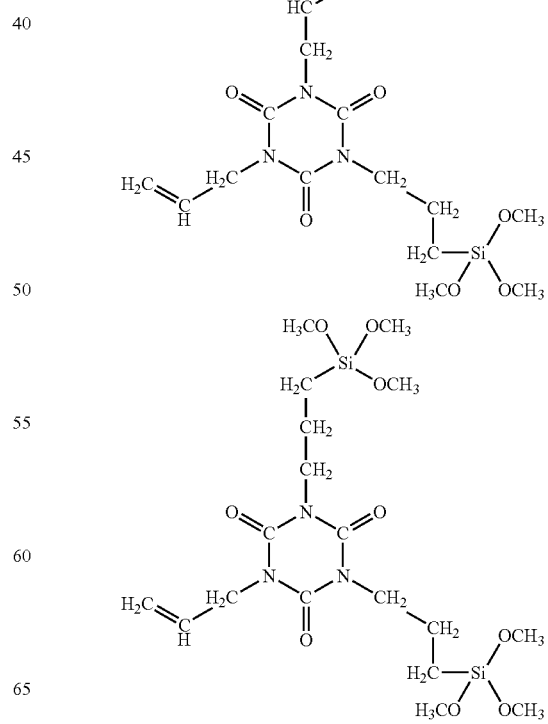

-continued

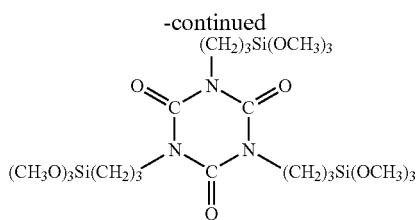

Of the organosilicon compounds described above, organosilicon compounds having a silicon atom-bonded alkoxy group and an alkenyl group or silicon atom-bonded hydrogen atom (SiH group) within each molecule are preferred as they yield cured products with particularly superior adhesion.

The blend amount of the adhesion assistant is typically not more than 10 parts by mass (namely, from 0 to 10 parts by mass), and is preferably from 0.1 to 8 parts by mass, and more preferably from 0.2 to 5 parts by mass, per 100 parts by mass of the component (A). A blend amount that is too large can have adverse effects on the hardness of the cured product, and may increase the surface tack.

—Curing Retarders

A curing retarder may be added to the composition of the present invention to ensure that the composition can be held in an uncured form at room temperature with favorable storage properties. Examples of the curing retarder include acetylene alcohols, silicone-modified acetylene alcohol compounds, triallyl isocyanurate, alkoxysilane-modified triallyl isocyanurates and partial hydrolysis-condensation products thereof (such as silicone-modified triallyl isocyanurates). The curing retarder is typically added in an amount within a range from 0.001 to 2 parts by mass, and preferably from 0.02 to 1 part by mass, per 100 parts by mass of the component (A).

A composition that is composed of essentially the component (A) and the component (B) is described below as a typical example of the composition of the present invention. The expression "composed of essentially the component (A) and the component (B)" means that besides the components (A) and (B), the composition may also include at least one of the optional components described above, provided the optional component is included in an amount that does not impair the objects and effects of the present invention.

—Preparation and Curing Conditions—

The silicone composition of the present invention is prepared by mixing the required components uniformly together. Typically, the composition is stored as two separate parts to prevent curing from proceeding, with the two parts then mixed and cured at the time of use. The composition may also be prepared as a one-pot composition by adding a small amount of a curing retarder. This type of composition may be prepared so as to undergo curing at room temperature, but usually curing at room temperature is inhibited by the curing retarder, with curing then being initiated when required by applying heat.

The curing conditions for the composition of the present invention typically involve heating at a temperature of 50 to 200° C., and preferably 70 to 180° C., for a period of 1 to 30 minutes, and preferably 2 to 10 minutes. Furthermore, post curing may also be conducted by heating at a temperature of 50 to 200° C., and particularly at 70 to 180° C., for a period of 0.1 to 10 hours, and preferably for 1 to 4 hours.

The composition of the present invention can be prepared in a variety of states from a liquid to a solid at room temperature according to purposes or molding methods and molding apparatus used. Especially, when the composition is a plastically deformable solid (which preferably has a melting point of 30° C. or higher) or a semisolid, it can be used readily within conventional molding methods and molding apparatus such as a transfer molding, compression molding or injection molding apparatus. Furthermore, by adding a solvent, the composition may also be used as a coating material or potting material.

EXAMPLES

A more detailed description of the present invention is provided below based on a series of synthesis examples, examples and comparative examples, although the present invention is in no way limited by the examples presented below. Viscosity values in the following examples refer to values measured at 25° C. Furthermore, the weight average molecular weight values refer to values measured by gel permeation chromatography (GPC) and referenced against polystyrene standards.

Synthesis Example 1

Synthesis of an Organopolysiloxane of Component (A)

27 mols of an organosilane represented by $PhSiCl_3$, 1 mol of $ClMe_2SiO(Me_2SiO)_{33}SiMe_2Cl$, 1.5 mols of $MeViSiCl_2$, and 1.5 mols of $MeHSiCl_2$ were dissolved in toluene solvent, the resulting solution was added dropwise to water to effect a cohydrolysis, the product was washed with water, neutralized by alkali washing, dewatered, and the solvent was then stripped, yielding a vinyl group-containing, hydrosilyl group-containing resin of the component (A) (hereafter referred to as "resin A1"). This resin A1 had a weight average molecular weight of 62,000 and a melting point of 60° C.

Synthesis Example 2

Synthesis of an Organopolysiloxane of Component (A)

27 mols of an organosilane represented by $PhSiCl_3$, 1 mol of $ClMe_2SiO(Me_2SiO)_{33}SiMe_2Cl$, 1.5 mols of $Me_2ViSiCl$, and 1.5 mols of $Me_2HSiCl$ were dissolved in toluene solvent, the resulting solution was added dropwise to water to effect a cohydrolysis, the product was washed with water, neutralized by alkali washing, dewatered, and the solvent was then stripped, yielding a vinyl group-containing, hydrosilyl group-containing resin of the component (A) (hereafter referred to as "resin A2"). This resin A2 had a weight average molecular weight of 63,000 and a melting point of 63° C.

Synthesis Example 3

27 mols of an organosilane represented by $PhSiCl_3$, 1 mol of $ClMe_2SiO(Me_2SiO)_{33}SiMe_2Cl$, and 3 mols of $MeViSiCl_2$ were dissolved in toluene solvent, the resulting solution was added dropwise to water to effect a cohydrolysis, the product was washed with water, neutralized by alkali washing, dewatered, and the solvent was then stripped, yielding a vinyl group-containing resin (hereafter referred to as "resin A3"). This resin A3 had a weight average molecular weight of 62,000 and a melting point of 60° C.

Synthesis Example 4

27 mols of an organosilane represented by $PhSiCl_3$, 1 mol of $ClMe_2SiO(Me_2SiO)_{33}SiMe_2Cl$, and 3 mols of $MeHSiCl_2$ were dissolved in toluene solvent, the resulting solution was added dropwise to water to effect a cohydrolysis, the product was washed with water, neutralized by alkali washing, dewatered, and the solvent was then stripped, yielding a hydrosilyl group-containing resin (hereafter referred to as "resin B3"). This resin B3 had a weight average molecular weight of 58,000 and a melting point of 58° C.

Synthesis Example 5

27 mols of an organosilane represented by $PhSiCl_3$, 1 mol of $ClMe_2SiO(Me_2SiO)_{33}SiMe_2Cl$, and 3 mols of $Me_2ViSiCl$ were dissolved in toluene solvent, the resulting solution was added dropwise to water to effect a cohydrolysis, the product was washed with water, neutralized by alkali washing, dewatered, and the solvent was then stripped, yielding a vinyl group-containing resin (hereafter referred to as "resin A4"). This resin A4 had a weight average molecular weight of 63,000 and a melting point of 63° C.

Synthesis Example 6

27 mols of an organosilane represented by $PhSiCl_3$, 1 mol of $ClMe_2SiO(Me_2SiO)_{33}SiMe_2Cl$, and 3 mols of $Me_2HSiCl$ were dissolved in toluene solvent, the resulting solution was added dropwise to water to effect a cohydrolysis, the product was washed with water, neutralized by alkali washing, dewatered, and the solvent was then stripped, yielding a hydrosilyl group-containing resin (hereafter referred to as "resin B4"). This resin B4 had a weight average molecular weight of 57,000 and a melting point of 56° C.

Synthesis Example 7

A mixture composed of 3.3 mols of phenyltrichlorosilane, 1.2 mols of methylvinyldichlorosilane, 1.5 mols of dimethyldichlorosilane and 530 g of toluene was added dropwise over a 60 minute period, with vigorous stirring, to 2,500 g of water. The reaction mixture was then stirred for a further 60 minutes, and then washed with water until neutral. Following the water washing, the siloxane concentration of the toluene solution was adjusted to 25%, 0.42 g of potassium hydroxide was added, and the resulting mixture was heated under reflux for 5 hours to allow the polymerization to proceed. Subsequently, 13.8 g of trimethylchlorosilane was added, and the resulting mixture was stirred at room temperature for 60 minutes to neutralize the alkali. Subsequently, the product was filtered and the toluene was removed by evaporation by heating under reduced pressure, thus yielding a transparent vinyl group-containing organopolysiloxane.

Synthesis Example 8

A mixture composed of 1.2 mols of phenyltrichlorosilane, 1.8 mols of methylvinyldichlorosilane, 0.06 mols of dimethyldichlorosilane, 2.4 mols of methylphenyldichlorosilane and 530 parts by mass of toluene was added dropwise over a 60 minute period, with vigorous stirring, to 2,500 g of water. The reaction mixture was then stirred for a further 60 minutes, and then washed with water until neutral. Following the water washing, the siloxane concentration of the toluene solution was adjusted to 25%, 0.42 g of potassium hydroxide was added, and the resulting mixture was heated under reflux for 5 hours to allow the polymerization to proceed. Subsequently, 13.8 g of trimethylchlorosilane was added, and the resulting mixture was stirred at room temperature for 60 minutes to neutralize the alkali. Subsequently, the product was filtered and the toluene was removed by evaporation by heating under reduced pressure, thus yielding a transparent vinyl group-containing organopolysiloxane.

Example 1

189 g of the vinyl group-containing, hydrosilyl group-containing resin obtained in synthesis example 1 (resin A1), 0.1 g of the acetylene alcohol-based compound ethynylcyclohexanol as a reaction retarder, and 0.05 g of an octyl alcohol-modified solution of chloroplatinic acid were mixed thoroughly in a planetary mixer heated at 60° C., yielding a silicone resin composition 1. This composition 1 was subjected to compression molding in a compression molding apparatus, and was then heat molded at 150° C. for 5 minutes, yielding a cured product. This cured product was then subjected to secondary curing at 150° C. for 4 hours, thus yielding a cured product.

The composition and the cured product were subjected to the following measurements.

Mechanical properties: the tensile strength (0.2 mm thickness) and elongation at rupture (0.2 mm thickness) were measured in accordance with JIS K 6251, and the hardness (measured using a type D durometer) was measured in accordance with JIS K 6253.

Tack finger test: evaluated by touching the surface of the cured product.

Tack silver powder test: immediately following secondary curing, the cured product was placed in a sample of a commercially available silver powder (average particle size: 5 μm), and following removal from the powder, the cured product was blown with air to test whether the silver powder on the surface of the product could be removed.

Thermal shock test: the composition was injected onto an aluminum dish (diameter: 6 cm, depth: 0.6 mm) and cured under the conditions described above. Following removal from the aluminum dish, the circular plate-shaped cured product sample was subjected to 100 cycles of a cooling and heating cycle across a temperature range from −50° C. to 150° C. The sample was then inspected visually for the presence of cracks. The results are shown in Table 1.

Example 2

189 g of the vinyl group-containing, hydrosilyl group-containing resin obtained in synthesis example 2 (resin A2), 0.1 g of the acetylene alcohol-based compound ethynylcyclohexanol as a reaction retarder, and 0.05 g of an octyl alcohol-modified solution of chloroplatinic acid were mixed thoroughly in a planetary mixer heated at 60° C., yielding a silicone resin composition 2.

Using the same procedure as that described for example 1, a molded product was produced from this composition 2, the product was subjected to secondary curing, and the properties of the resulting cured product were measured. The results are shown in Table 1.

Comparative Example 1

189 g of the vinyl group-containing resin obtained in synthesis example 3 (resin A3), 189 g of the hydrosilyl group-containing resin obtained in synthesis example 4 (resin B3), 0.2 g of the acetylene alcohol-based compound ethynylcyclohexanol as a reaction retarder, and 0.1 g of an octyl alcohol-modified solution of chloroplatinic acid were mixed thoroughly in a planetary mixer heated at 60° C., yielding a silicone resin composition 3.

This composition 3 was subjected to compression molding in a compression molding apparatus, and was then heat molded at 150° C. for 5 minutes, yielding a cured product. This cured product was then subjected to secondary curing at 150° C. for 4 hours, thus yielding a cured product.

The properties of the composition 3 and the obtained cured product were measured in the same manner as example 1. The results are shown in Table 1.

Comparative Example 2

189 g of the vinyl group-containing resin obtained in synthesis example 5 (resin A4), 189 g of the hydrosilyl group-containing resin obtained in synthesis example 6 (resin B4), 0.2 g of the acetylene alcohol-based compound ethynylcyclohexanol as a reaction retarder, and 0.1 g of an octyl alcohol-modified solution of chloroplatinic acid were mixed thoroughly in a planetary mixer heated at 60° C., yielding a silicone resin composition 4. This composition 4 was treated in the same manner as example 1 to produce a cured product.

The properties of the composition 4 and the obtained cured product were measured in the same manner as example 1. The results are shown in Table 1.

Comparative Example 3

100 g of the vinyl group-containing silicone obtained in synthesis example 7, 10 g of the vinyl group-containing silicone obtained in synthesis example 8, 12 g of an organohydrogenpolysiloxane represented by a formula (4) shown below, 18 g of an organohydrogenpolysiloxane represented by a formula (5) shown below, and 0.05 g of a 1% octyl alcohol solution of chloroplatinic acid were mixed thoroughly, yielding a silicone resin composition 5. This composition 5 was treated in the same manner as example 1 to produce a cured product.

The properties of the composition 5 and the obtained cured product were measured in the same manner as example 1. The results are shown in Table 1.

Comparative Example 4

70 g of the vinyl group-containing silicone obtained in synthesis example 7, 19.5 g of a vinyl group-containing silicone represented by a formula (6) shown below, 10.5 g of an vinyl group-containing silicone represented by a formula (7) shown below, 12 g of an organohydrogenpolysiloxane represented by a formula (8) shown below, 6.8 g of an organohydrogenpolysiloxane represented by the formula (5) shown above, and 0.05 g of a 1% octyl alcohol solution of chloroplatinic acid were mixed thoroughly, yielding a silicone resin composition 6. This composition 6 was treated in the same manner as example 1 to produce a cured product.

The properties of the composition 6 and the obtained cured product were measured in the same manner as example 1. The results are shown in Table 1.

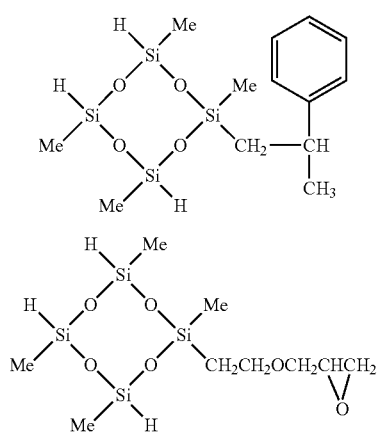

(4)

(5)

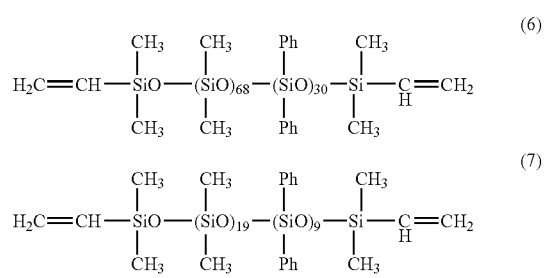

(6)

(7)

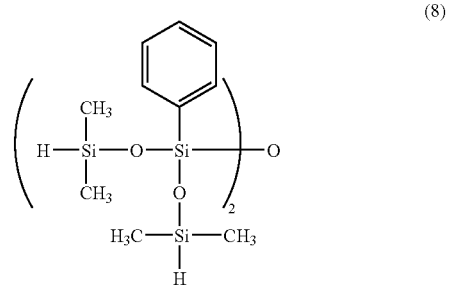

(8)

TABLE 1

|  | Example 1 | Example 2 | Comparative example 1 | Comparative example 2 | Comparative example 3 | Comparative example 4 |
| --- | --- | --- | --- | --- | --- | --- |
| SiH/SiVi | 1.0 | 1.0 | 1.0 | 1.0 | 1.0 | 1.0 |
| Secondary curing conditions | 150° C./4 hr | 150° C./4 hr | 150° C./4 hr | 150° C./4 hr | 150° C./4 hr | 150° C./4 hr |
| External appearance | colorless, transparent | colorless, transparent | slightly cloudy | slightly cloudy | colorless, transparent | colorless, transparent |
| Hardness (type D) | 50 | 52 | 50 | 52 | 70 | 52 |
| Elongation at rupture (%) | 20 | 20 | 20 | 20 | 0 | 0 |
| Tensile strength (MPa) | 9 | 9 | 9 | 9 | 2 | 2 |
| Dust adhesion caused by surface tack | none | none | none | none | none | none |
| Thermal shock test (100 cycles) | no cracks | no cracks | no cracks | no cracks | cracks evident | cracks evident |

INDUSTRIAL APPLICABILITY

The composition of the present invention forms a flexible cured product upon curing that exhibits a high degree of hardness and no surface tack, and can therefore be used as a protective coating material, potting material, casting material or molding agent or the like for electrical or electronic components, and can also be used for all manner of silicone general-purpose applications such as the surface coating for silicone rubber keyboards. The composition of the present invention is particularly useful in applications where the surface tack of conventional silicones would normally cause problems.

What is claimed is:

1. An addition-curable silicone composition, comprising:
   (A) an organopolysiloxane formed from $R^1SiO_{1.5}$ units, $R^2{}_2SiO$ units, $R^3{}_aR^4{}_bSiO_{(4-a-b)/2}$ units and $R^3{}_cH_dSiO_{(4-c-d)/2}$ units, wherein each $R^1$, $R^2$ and $R^3$ represents, independently, a hydroxyl group, methyl group, ethyl group, propyl group, cyclohexyl group, or phenyl group, each $R^4$ represents, independently, a vinyl group or allyl group, a represents 0, 1 or 2 and b represents 1 or 2, provided that a+b is 2 or 3, and c represents 0, 1 or 2 and d represents 1 or 2, provided that c+d is 2 or 3,
   including a structure in which at least a portion of the $R^2{}_2SiO$ units are connected together in a continuous repeating sequence, and a number of units in the continuous repeating sequence is within a range from 5 to 300, and
   having a molar ratio of hydrogen atoms bonded to silicon atoms relative to a total of all vinyl groups and/or allyl groups bonded to silicon atoms that exist within a molecule of 0.1 to 4.0, and
   (B) a platinum group metal-based catalyst in an effective amount for curing.

2. The silicone composition according to claim 1, which is solid at room temperature.

3. The composition according to claim 1, wherein component (A) contains a silanol group.

4. The composition according to claim 1, wherein the number of $R^2{}_2SiO$ units in the continuous repeating sequence in component (A) is within a range from 10 to 300.

5. The composition according to claim 1, wherein the number of $R^2{}_2SiO$ units in the continuous repeating sequence in component (A) is within a range from 15 to 200.

6. The composition according to claim 1, wherein the number of $R^2{}_2SiO$ units in the continuous repeating sequence in component (A) is within a range from 20 to 100.

7. The composition according to claim 1, wherein at least 50 mol % of all the $R^2{}_2SiO$ units that exist within the organopolysiloxane of component (A) form a continuous repeating chain structure.

8. The composition according to claim 1, wherein the organopolysiloxane of component (A) has a total of at least two vinyl groups and/or allyl groups bonded to silicon atoms within each molecule, and also has at least two hydrosilyl groups.

9. The composition according to claim 1, wherein the organopolysiloxane of component (A) has a total of at least three vinyl groups and/or allyl groups bonded to silicon atoms within each molecule, and also has at least three hydrosilyl groups.

10. The composition according to claim 1, wherein within the organopolysiloxane of component (A), a molar ratio of $R^1SiO_{1.5}$ units:$R^2{}_2SiO$ units:$R^3{}_aR^4{}_bSiO_{(4-a-b)/2}$ units:$R^3{}_cH_dSiO_{(4-c-d)/2}$ units is 90 to 24:75 to 9:25 to 0.5:25 to 0.5, provided that a total of all four siloxane units is 100.

11. The composition according to claim 1, wherein within the organopolysiloxane of component (A), a molar ratio of $R^1SiO_{1.5}$ units:$R^2{}_2SiO$ units:$R^3{}_aR^4{}_bSiO_{(4-a-b)/2}$ units:$R^3{}_cH_dSiO_{(4-c-d)/2}$ units is 70 to 28:70 to 20:5 to 1:5 to 1, provided that a total of all four siloxane units is 100.

12. The composition according to claim 1, wherein a polystyrene-referenced weight average molecular weight of the organopolysiloxane of component (A) measured using gel permeation chromatography (GPC) is within a range from 3,000 to 1,000,000.

13. The composition according to claim 1, wherein a polystyrene-referenced weight average molecular weight of the organopolysiloxane of component (A) measured using gel permeation chromatography (GPC) is within a range from 10,000 to 100,000.

14. A cured product obtained by curing an addition-curable silicone composition, comprising:
   (A) an organopolysiloxane formed from $R^1SiO_{1.5}$ units, $R^2{}_2SiO$ units, $R^3{}_aR^4{}_bSiO_{(4-a-b)/2}$ units and $R^3{}_cH_dSiO_{(4-c-d)/2}$ units, wherein each $R^1$, $R^2$ and $R^3$ represents, independently, a hydroxyl group, methyl group, ethyl group, propyl group, cyclohexyl group, or phenyl group, each $R^4$ represents, independently, a vinyl group or allyl group, a represents 0, 1 or 2 and b represents 1 or 2, provided that a+b is 2 or 3, and c represents 0, 1 or 2 and d represents 1 or 2, provided that c+d is 2 or 3,
   including a structure in which at least a portion of the $R^2{}_2SiO$ units are connected together in a continuous repeating sequence, and a number of units in the continuous repeating sequence is within a range from 5 to 300, and
   having a molar ratio of hydrogen atoms bonded to silicon atoms relative to a total of all vinyl groups and/or allyl groups bonded to silicon atoms that exist within a molecule of 0.1 to 4.0, and
   (B) a platinum group metal-based catalyst in an effective amount for curing.

* * * * *